(12) United States Patent
Hu

(10) Patent No.: US 10,002,852 B1
(45) Date of Patent: Jun. 19, 2018

(54) PACKAGE ON PACKAGE CONFIGURATION

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days. days.

(21) Appl. No.: 15/380,716

(22) Filed: Dec. 15, 2016

(51) Int. Cl.
  *H01L 21/02* (2006.01)
  *H01L 25/065* (2006.01)
  *H01L 23/00* (2006.01)
  *H01L 23/31* (2006.01)
  *H01L 25/00* (2006.01)

(52) U.S. Cl.
  CPC ...... *H01L 25/0657* (2013.01); *H01L 23/3157* (2013.01); *H01L 24/02* (2013.01); *H01L 24/17* (2013.01); *H01L 25/50* (2013.01); *H01L 2224/02372* (2013.01); *H01L 2224/02373* (2013.01); *H01L 2224/175* (2013.01); *H01L 2225/06517* (2013.01); *H01L 2225/06527* (2013.01); *H01L 2225/06544* (2013.01)

(58) Field of Classification Search
  None
  See application file for complete search history.

(56) References Cited

U.S. PATENT DOCUMENTS

| 9,153,560 | B2 | 10/2015 | Lane et al. | |
| 9,490,167 | B2 | 11/2016 | Chen et al. | |
| 9,543,242 | B1 * | 1/2017 | Kelly | H01L 23/49816 |
| 9,607,967 | B1 * | 3/2017 | Shih | H01L 25/0657 |
| 9,673,148 | B2 * | 6/2017 | Hu | H01L 23/5386 |
| 9,812,426 | B1 * | 11/2017 | Wang | H01L 25/0657 |
| 2009/0200662 | A1 * | 8/2009 | Ng | H01L 21/486 257/723 |
| 2010/0244218 | A1 * | 9/2010 | Chai | H01L 21/768 257/686 |
| 2011/0063806 | A1 * | 3/2011 | Kariya | H01L 21/4857 361/748 |
| 2013/0037950 | A1 * | 2/2013 | Yu | H01L 23/49816 257/738 |
| 2015/0262909 | A1 * | 9/2015 | Chen | H01L 21/6835 257/774 |
| 2015/0318262 | A1 * | 11/2015 | Gu | H01L 23/49811 257/738 |
| 2015/0371965 | A1 * | 12/2015 | Hu | H01L 21/78 257/737 |
| 2016/0035711 | A1 | 2/2016 | Hu | |
| 2016/0064254 | A1 * | 3/2016 | Hu | H01L 21/486 174/258 |
| 2017/0033083 | A1 * | 2/2017 | Lin | H01L 23/49838 |

* cited by examiner

Primary Examiner — Michael Lebentritt
(74) Attorney, Agent, or Firm — JCIPRNET

(57) ABSTRACT

A first integrated circuit (IC) package has a package substrate on bottom. The package substrate comprises a bottom redistribution circuitry configured according to printed circuit board (PCB) design rule and a top redistribution circuitry configured according to integrated circuit (IC) design rule. The first IC package has a plurality of top metal pads and a plurality of copper pillars configured on a top side according to IC design rule. A second IC package has a plurality of bottom metal pads configured according to IC design rule configured on a top side of the first IC package. The first IC package electrically couples to the second IC package through the plurality of copper pillars.

12 Claims, 6 Drawing Sheets

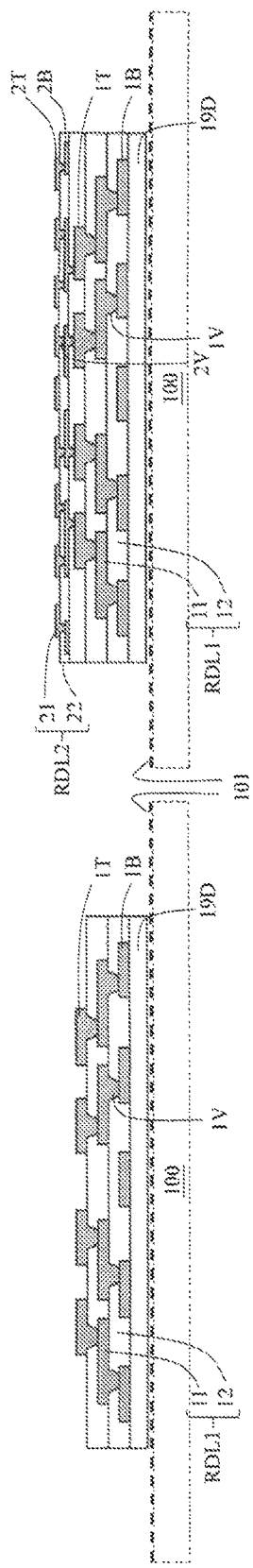

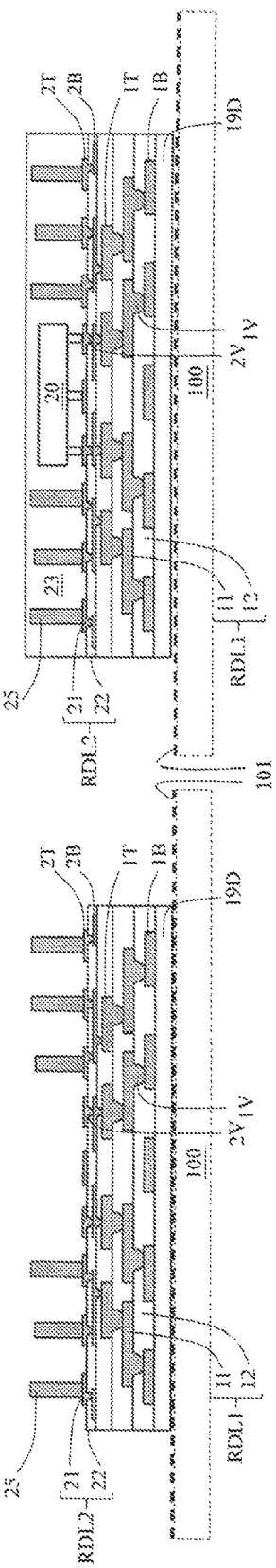

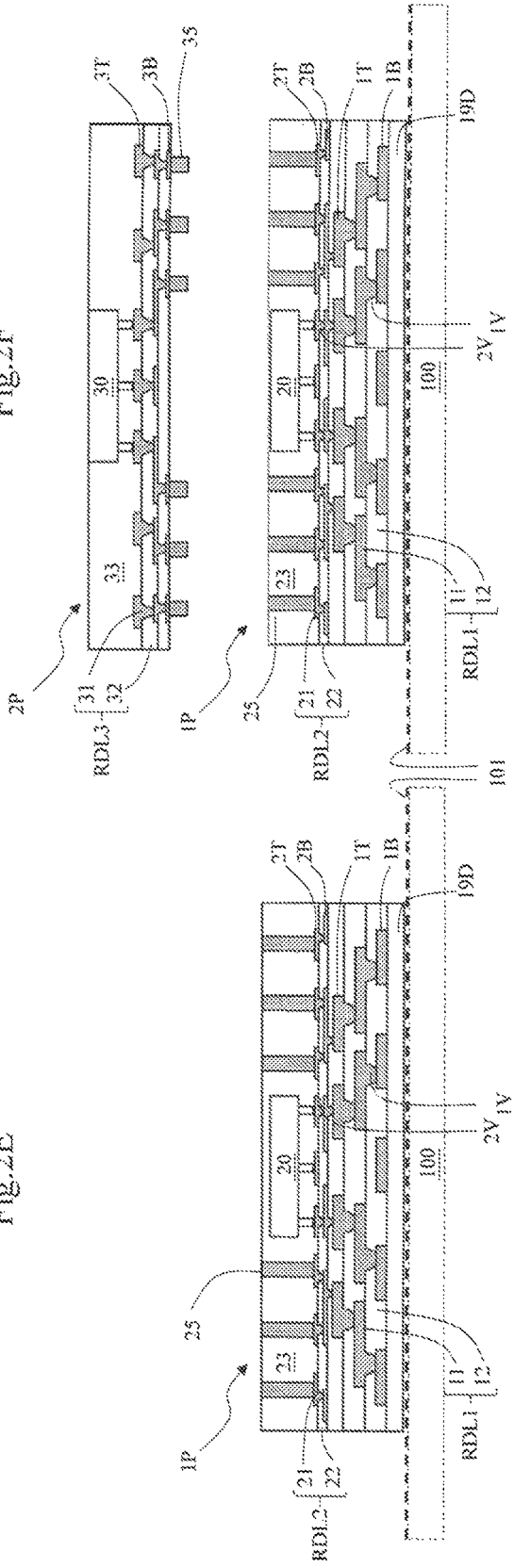

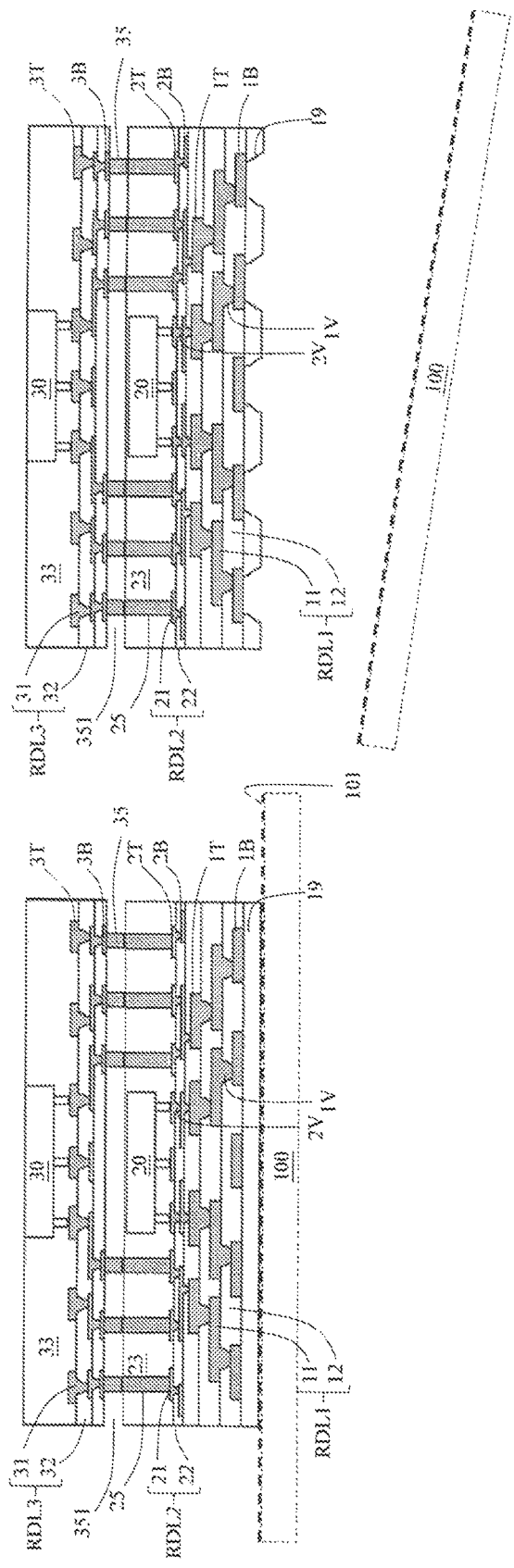

PACKAGE ON PACKAGE CONFIGURATION

BACKGROUND

Technical Field

The present invention relates to a package on package configuration, especially relates to a package substrate having a plurality of copper pillars configured on high density side and fabricated according to integrated circuit (IC) design rule.

Description of Related Art

FIG. 1 shows a prior art U.S. Pat. No. 9,153,560

FIG. 1 shows a prior art which discloses a package on package (PoP) integrated device. The integrated device 1100 includes a first package 1102 and a second package 1104. The first package 1102 includes a first substrate 1106, a first die (e.g., chip) 1108, an encapsulation material 1112, a first set of solder balls 1116, a first set of interconnects 1118, and a first set of package interconnects 1125 (e.g., copper pillar). The second package 1104 includes a second substrate 1105, a second die 1107 a third die 1109, a fourth die 1137, a fifth die 1139, a sixth die 1157, a seventh die 1159, a eighth die 1167, a ninth die 1169, a second set of solder balls 1115, a second set of interconnect 1117, a third set of interconnects 1119, a fourth set of interconnects 1147, and a fifth set of interconnects 1149. The second package 1104 is positioned above the first package 1102.

The prior art described a redistribution circuitry fabricated according a single rule within the substrate 1105, 1106 which cannot be applied to the instant invention comprising a package substrate with at least two redistribution circuitry fabricated according to different design rules.

BRIEF DESCRIPTION OF THE DRAWINGS

FIGS. 2A~2J show a fabrication process for a package on package configuration according to the present invention.

DETAILED DESCRIPTION OF THE INVENTION

A first IC package has a plurality of top metal pads configured according to IC design rule. A plurality of copper pillars are configured on the top side of the IC package. A second IC package has a plurality of bottom metal pads configured according to IC design rule. The second IC package is stacked on a top side of the first IC package, the second IC package is electrically couples to the first IC package through the plurality of copper pillars which is fabricated according to IC design rule.

Figure 1:
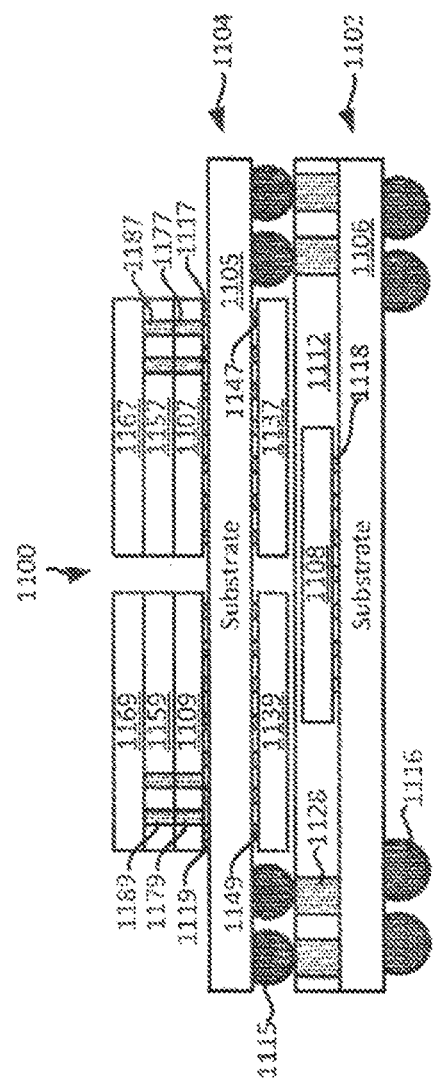
FIG. 1 shows a prior art
Figures 2I, 2J:
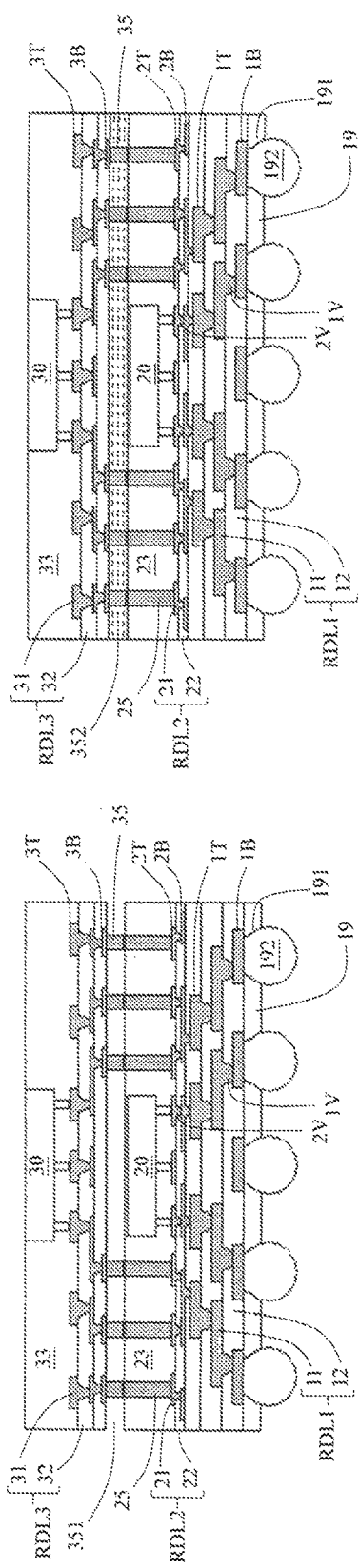

FIGS. 2A~2J show a fabrication process for a package on package configuration according to the present invention.

FIG. 2A shows:

preparing a temporary carrier 100 with a release layer 101 on a top side of the temporary carrier 100;

forming a first dielectric layer 19D on a top side of the release layer 101;

fabricating a first redistribution circuitry 11 according to PCB design rule; the first redistribution circuitry 11 having a plurality of first bottom metal pads 1B and a plurality of first top metal pads 1T; a plurality of first metal via 1V electrically coupling the first bottom metal pads 1B to the first top metal pads 1T; each of the first metal vias has a shape with top wide bottom narrow.

FIG. 2B shows:

fabricating a second redistribution circuitry 21 according to IC design rule on a top side of the first redistribution circuitry 11; the second redistribution circuitry 21 having a plurality of second bottom metal pads 2B and a plurality of second top metal pads 2T, a plurality of second metal via 2V electrically coupling the second bottom metal pads 2B to the second top metal pads 2T; each of the second metal vias 2V has a shape with top wide bottom narrow;

at least one first dielectric layer 12 embedding the first redistribution circuitry 11 to form a first redistribution layer RDL1; and at least one second dielectric layer 22 embedding the second redistribution circuitry 21 to form a second redistribution layer RDL2.

FIG. 2C shows:

configuring a plurality of copper pillars 25 on a top side of the second top metal pads 2T among the plurality of second top metal pads 2T of the second redistribution circuitry 21.

FIG. 2D shows:

applying a dielectric layer 23 to embed the at least one first chip 20 to form a first IC package 1P.

FIG. 2E shows:

flattening a top side of the dielectric layer 23 and the plurality copper pillars 25.

FIG. 2F shows:

preparing a second IC package 2P, in a later step the second IC package shall stack on a top side of the first IC package; the second IC package 2P comprising a third redistribution circuitry 31 configured according to IC design rule, the third redistribution circuitry 31 embedded in at least one third dielectric layer 32, the third redistribution circuitry 31 and the at least one third dielectric layer 32 forming a third redistribution layer RDL3; the third redistribution circuitry 31 having a plurality of third bottom metal pads 3B on a bottom side and a plurality of third top metal pads 3T on a top side, and at least one second chip 30 configured on a top side of the third redistribution circuitry 31 and embedded in a molding compound 33. A plurality of metal contacts 35, such as copper pillars, configured on a bottom side of the third redistribution circuitry 31.

FIG. 2G shows:

stacking the second IC package 2P on a top side of the first IC package 1P. Each of the plurality of metal contacts 35 electrically coupled to a corresponding first copper pillar 25 among the plurality of first copper pillars 25. A gap 351 is formed between the second IC package and the first IC package, the gap 351 has a space height roughly equals to a height of the plurality of metal contacts 35.

FIG. 2H shows:

removing the temporary carrier 100 from a bottom side of the first redistribution circuitry 11, and forming a plurality of opening 191 from a bottom side of the dielectric layer 19. Each opening 191 exposes a bottom surface of a corresponding first metal pad 1B among the plurality of first bottom metal pad 1B.

FIG. 2I shows:

planting a plurality of solder balls 192, each solder 192 configured on a bottom side of a corresponding first bottom metal pad 1B among the plurality of first bottom metal pads 1B.

FIG. 2J shows:

filling a bonding material 254 in the gap 253 to enhance the bounding strength therebetween.

While several embodiments have been described by way of example, it will be apparent to those skilled in the art that various modifications may be configured without departs from the spirit of the present invention. Such modifications are all within the scope of the present invention, as defined by the appended claims.

| Numerical system | |
|---|---|
| 100 | temporary carrier |
| 101 | release layer |
| 11 | first redistribution circuitry |
| 12 | first dielectric layer |
| 191 | openings |
| 192 | solder balls |
| 19D | dielectric layer |
| 1B | first bottom metal pads |
| 1P | first IC package |
| 1T | first top metal pads |
| 1V | first metal vias |
| 20 | chip |
| 21 | second redistribution circuitry |
| 23 | dielectric layer |
| 24 | trenches |
| 25 | copper pillars |
| 253 | gap |
| 254 | bonding material |
| 2B | second bottom metal pads |
| 2P | second IC package |
| 2T | second top metal pads |
| 2V | second metal vias |
| 30 | chip |
| 31 | third redistribution circuitry |
| 32 | third dielectric layer |
| 33 | molding compound |
| 35 | metal contacts |
| 3B | third bottom metal pads |
| 3T | third top metal pads |
| RDL1 | first redistribution layer |
| RDL2 | second redistribution layer |
| RDL3 | third redistribution layer |

What is claimed is:

1. A package on package configuration, comprising:
a first redistribution circuitry having a plurality of first bottom metal pads and a plurality of first top metal pads, a plurality of first metal via electrically coupling the first bottom metal pads to the first top metal pads, wherein each of the first metal vias has a shape with top wide bottom narrow;
a second redistribution circuitry configured on a top side of the first redistribution circuitry and having a plurality of second bottom metal pads and a plurality of second top metal pads, a plurality of second metal via electrically coupling the second bottom metal pads to the second top metal pads, wherein each of the second metal vias has a shape with top wide bottom narrow;
a bottommost layer of the second metal vias electrically coupled to the first top metal pads;
at least one first chip configured on a top side of the second top metal pads among the plurality of second top metal pads;
a molding compound embedding the at least one first chip; and
a plurality of copper pillars configured on a top side of the second top metal pads among the plurality of the second top metal pads.

2. The package on package configuration as claimed in claim 1, further comprising:
a second IC package configured on a top side of the plurality of copper pillars.

3. The package on package configuration as claimed in claim 2, further comprising:
a third redistribution circuitry configured on a bottom side of the second IC package; and
a plurality of metal contacts configured on a bottom side of the third redistribution circuitry.

4. The package on package configuration as claimed in claim 3, wherein
the plurality of metal contacts electrically coupled to the plurality of copper pillars respectively.

5. The package on package configuration as claimed in claim 4, wherein
a gap is formed between the second IC package and the first IC package.

6. The package on package configuration as claimed in claim 5, wherein the gap has a space height roughly equals to a height of the plurality of metal contacts.

7. The package on package configuration as claimed in claim 6, wherein a bonding material fills in the gap to enhance the bounding strength therebetween.

8. A fabrication process for a package on package configuration comprising:
fabricating a first redistribution circuitry having a plurality of first bottom metal pads and a plurality of first top metal pads, a plurality of first metal via electrically coupling the first bottom metal pads to the first top metal pads, wherein each of the first metal vias has a shape with top wide bottom narrow;
fabricating a second redistribution circuitry on a top side of the first redistribution circuitry, the second redistribution circuitry having a plurality of second bottom metal pads and a plurality of second top metal pads, a plurality of second metal vias electrically coupling the second bottom metal pads to the second top metal pads, wherein each of the second metal vias has a shape with top wide bottom narrow;
configuring a plurality of copper pillars on a top side of the second top metal pads among the plurality of the second top metal pads;
configuring at least one first chip on a top side of the second top metal pads among the plurality of second top metal pads; and
applying a dielectric layer to embed the at least one first chip.

9. The fabrication process as claimed in claim 8, further comprising:
configuring a second IC package on a top side of the plurality of copper pillars.

10. The fabrication process as claimed in claim 9, further comprising:
configuring a third redistribution circuitry on a bottom side of the second IC package; and
configuring a plurality of metal contacts on a bottom side of the third redistribution circuitry.

11. The fabrication process as claimed in claim 10, further comprising:
electrically coupling the plurality of metal contacts to the plurality of copper pillars; wherein
a gap is formed between the second IC package and the first IC package, and the gap has a space height roughly equals to a height of the plurality of top metal pads on a top side of the copper pillars.

12. The fabrication process as claimed in claim 11, further comprising:
filling a bonding material in the gap to enhance the bounding strength therebetween.

* * * * *